United States Patent
Dai et al.

(10) Patent No.: US 8,890,259 B2
(45) Date of Patent: Nov. 18, 2014

(54) SCR APPARATUS AND METHOD FOR ADJUSTING THE SUSTAINING VOLTAGE

(75) Inventors: Meng Dai, Wuxi (CN); Zhongyu Lin, Wuxi (CN)

(73) Assignees: CSMC Technologies Fab1 Co., Ltd., Wuxi (CN); CSMC Technologies FAB2 Co., Ltd., Wuxi (CN)

( * ) Notice: Subject to any disclaimer, the term of this patent is extended or adjusted under 35 U.S.C. 154(b) by 0 days.

(21) Appl. No.: 13/807,317

(22) PCT Filed: Dec. 5, 2011

(86) PCT No.: PCT/CN2011/083454
§ 371 (c)(1),
(2), (4) Date: Dec. 28, 2012

(87) PCT Pub. No.: WO2012/079477
PCT Pub. Date: Jun. 21, 2012

(65) Prior Publication Data
US 2013/0099278 A1 Apr. 25, 2013

(30) Foreign Application Priority Data

Dec. 17, 2010 (CN) .......................... 2010 1 0593440

(51) Int. Cl.
| | | |
|---|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/74 | (2006.01) |
| H01L 31/111 | (2006.01) |
| H01L 21/8238 | (2006.01) |
| H01L 27/06 | (2006.01) |
| H01L 27/02 | (2006.01) |
| H01L 29/87 | (2006.01) |
| H01L 29/749 | (2006.01) |
| H01L 29/10 | (2006.01) |

(52) U.S. Cl.
CPC ........ *H01L 27/0623* (2013.01); *H01L 27/0262* (2013.01); *H01L 29/87* (2013.01); *H01L 29/749* (2013.01); *H01L 29/1016* (2013.01)
USPC ........... 257/371; 257/133; 257/107; 257/140; 438/223; 438/224; 438/227

(58) Field of Classification Search
USPC ................... 257/133, 371, 23, 107, 918, 140; 361/56; 438/135, 133, 223, 224, 227, 438/228, 22
See application file for complete search history.

(56) References Cited

U.S. PATENT DOCUMENTS

| | | | |
|---|---|---|---|
| 7,910,951 B2 * | 3/2011 | Vashchenko | 257/175 |
| 2009/0268361 A1 * | 10/2009 | Mallikarjunaswamy | 361/56 |
| 2011/0241069 A1 * | 10/2011 | Vashchenko | 257/140 |

* cited by examiner

*Primary Examiner* — A. Sefer
*Assistant Examiner* — Dilinh Nguyen
(74) *Attorney, Agent, or Firm* — Anova Law Group, PLLC

(57) ABSTRACT

An SCR apparatus includes an SCR structure and a first N injection region. The SCR structure includes a P+ injection region, a P well, an N well and a first N+ injection region, the first N injection region is located under an anode terminal of the P+ injection region of the SCR structure. A method for adjusting a sustaining voltage therefor is provided as well.

5 Claims, 2 Drawing Sheets

SCR APPARATUS AND METHOD FOR ADJUSTING THE SUSTAINING VOLTAGE

TECHNICAL FIELD

The present invention generally relates to semiconductor integrated circuit (IC) and more particularly relates to an SCR apparatus for IC electrostatic, discharge protection and a method for adjusting the sustaining voltage.

BACKGROUND

Electrostatic discharge (ESD) is a natural phenomenon in daily life. In ESD, in a short time, heavy currents will be generated, causing fatal damage to ICs, and even causing malfunction in ICs' manufacturing and application. For example, when the ESD occurs on human body (short for HBM), the discharge usually occurs in a time of only hundreds of nanosecond and the current peak can reach several amperes. Other modes of ESD, such as the MM and the CDM, the discharge time is even shorter and thus the current is heavier. Such heavy current flows through the IC in a short time usually results in power consumption seriously exceeding the maximum endure value of the IC, and thus cause serious physical damage to the IC and lead to malfunction.

Two main aspects, including environment and circuitry, are considered to lighten the impact caused by the ESD. As for the environmental aspect, reducing the generation of electrostatic and timely elimination of the electrostatic could be used. For example, to use materials difficult to generate electrostatic, to increase the environment humidity, to ground the operating staff and the apparatus etc. While as for the circuitry aspect, the major consideration is to increase the ESD enduring ability of the IC itself. For instance, to add additional electrostatic protection apparatus or circuit to protect the inner circuit of the IC from being damaged by the ESD.

For the apparatus used for high voltage IC ESD protection, several important parameters shall be noticed. The first shall be the blocking voltage. High blocking voltage will keep the apparatus staying at a high-impedance state when the apparatus works in a normal high voltage, therefore the normal work of other circuits are not affected. The second shall be the trigger voltage. Proper trigger voltage shall be incorporated in order to protect the inner circuits. Thirdly, the sustaining voltage shall be higher than the working voltage, to prevent the effect of latching up. The fourthly consideration shall be the sufficient self-protection ability to protect itself from being affected by ESD. Conventional apparatus used for high voltage ESD protection, such as SCR, Diode, LDMOS etc., usually cannot meet the requirement of all the considerations mentioned above. For example, as the sustaining voltages of the SCR and the LDMOS are comparatively low, it is easy to cause the effect of latching up which will lead to malfunction of the circuit even the IC works in a normal state. As to the Diode, it would probably cost large device area in order to achieve sufficient self-protection ability thereof.

SUMMARY

An SCR apparatus includes an SCR structure and a first N injection region. The SCR structure includes a P+ injection region, a P well, an N well and a first N+ injection region, the first N injection region is located under an anode terminal of the P+ injection region of the SCR structure.

A method for adjusting a sustaining voltage for an SCR apparatus includes: providing a SCR structure comprising a P+ injection region, a P well, an N well and a first N+ injection region; providing a first N injection region locating under an anode terminal of the P+ injection region; adjusting the dosage of the first N injection region.

A method for adjusting a sustaining voltage for an SCR apparatus includes: providing a SCR structure comprising a P+ injection region, a P well, an N well and a first N+ injection region; adjustably forming an N injection region, with a predetermined depending injection energy and doping concentration, under an anode terminal of the P+ injection region.

DETAILED DESCRIPTION OF THE EMBODIMENTS

The present disclosure will be described in detail with the following embodiments and drawings.

Figure 1:
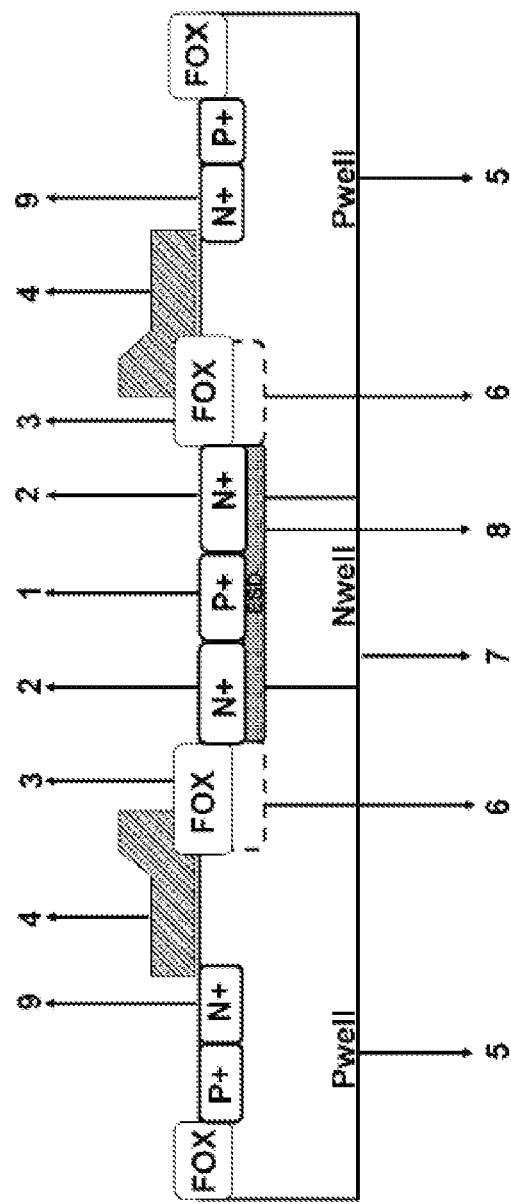
FIG. 1 shows an SCR structure for ESD protection in accordance with an exemplary embodiment of the present disclosure.

As a particular embodiment of the present apparatus for ESD protection, FIG. 1 shows an SCR-LDMOS structure Which includes a P+ injection region 1, an N+ injection region 2, a FOX 3, a POLY 4, a P well 5, an N injection region 6, an N well 7, an N injection region 8 and an N+ injection region 9. Basically, a LDMOS may include the N+ injection region 2, the FOX 3, the POLY 4 and the N+ injection region 9, A basic SCR may include the P+ injection region 1, the P well 5, the N well 7 and the N+ injection region 9. According to the current exemplary embodiment, the N injection region 8 is formed under the P+ injection region 1 and the N+ injection region 2, and be adjacent to the P well 5, the N well 7. Furthermore, the present apparatus includes the N injection region 6 at the drifting region of the LDMOS. The N injection region 6 is under the FOX 3 and being adjacent to the N injection region 8.

Figure 2:
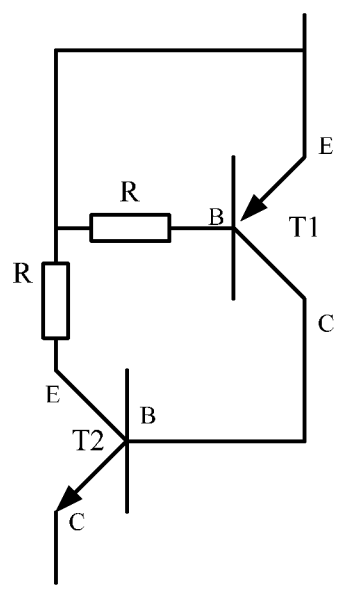
FIG. 2 shows an equivalent circuit of the SCR structure according to FIG. 1.

FIG. 2 shows an equivalent circuit of the SCR structure according to FIG. 1. The P+ injection region 1, the P well 5, the N well 7, the N injection region 8 and the N+ injection region 9 jointly form a four-layer-PNPN SCR structure. The P+ injection region 1, the P well 5, the N well 7 and the N injection region 8 jointly form a T1 transistor according to FIG. 2. The P well 5, the N well 7 and the N injection region 8 together form a T2 transistor. The R in FIG. 2 stands for the resistance of the N well 7 in FIG. 1.

The present apparatus provides the injection region 8 (which may be injected by ESD) to lower the resistance at the base of the transistor T1. Taken a view from FIG. 2 illustrating the equivalent circuit, the resistance R is thus reduced. At the same time, the doping level of the base region of T1 is increased and the β value (magnification rate) is reduced. The reduced β value means that the break resistance of the transistor T1 is increased and thus the sustaining voltage of the apparatus is increased in TLP testing. Furthermore, as for the transistor T1, the reduced resistance of the R means that the resistance between the base (B) and the emitter (E) thereof is reduced and thus the voltage between the B and the E is reduced. Therefore, the base current of the transistor T1 is reduced and the saturation voltage drop is increased, thus the sustaining voltage of the SCR is increased. As for the transistor T2, the reduced resistance of the R means that the voltage between the collector (C) and the emitter (E) is increased and thus the transistor T2 can be broken into the saturation region easily and finally the trigger voltage of the whole SCR structure is reduced.

In application when the present apparatus is incorporated for ESD protection, the drains 1 and 2 are connected to a high potential region and the source 9 is connected to a low potential region. The apparatus will stay in off-state and the SCR is shutdown when there is no ESD. When there is an ESD, a high potential will be generated at the drains, which will lead to the breakdown of the N well 7 and the P well 5 of the SCR structure. The transistors T1 and T2 having PNP-NPN structures couples to operate the SCR to be unlocked and to release the ESD current. Due the existence of the N injection region 8, the doping concentration of the N well 7, in which the breakdown occurs, is increased. The extendible size in the depletion region is reduced and the trigger voltage of the SCR could thereby be reduced. As mentioned above, the break resistance of the present apparatus is increased and therefore the sustaining voltage is increased correspondingly.

In accordance with other exemplary embodiments of the present disclosure, the trigger voltage and the sustaining voltage could be adjusted by altering the injection energy and concentration, to achieve a large adjustability of the current apparatus.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. An SCR device, comprising:
   an SCR structure and an LDMOS; and
   a first N injection region,
   wherein the SCR structure comprises a P+ injection region, a P well, an N well and a first N+ injection region that is within the P well,
   the LDMOS comprises a second N+ injection region, a FOX, a POLY, and the first N+ injection region, and
   the first N injection region is located under the P+ injection region of the SCR structure and the second N+ injection region of the LDMOS, disposed between both of the P+ injection region and the second N+ injection region and the N well, and contacting the P well.

2. The SCR device according to claim 1, further comprising a second N injection region at a drifting region of the LDMOS, the second N injection region being located under the FOX, between the FOX and the P well, and connected to the first N injection region under the second N+ injection region.

3. A method for adjusting a sustaining voltage for an SCR device, comprising:
   providing a SCR structure comprising a P+ injection region, a P well, an N well and a first N+ injection region that is within the P well;
   providing an LDMOS comprising a second N+ injection region, a FOX, a POLY, and the first N+ injection region;
   providing a first N injection region locating under the P+ injection region of the SCR structure and the second N+ injection region of the LDMOS, disposed between both of the P+ injection region and the second N+ injection region and the N well, and contacting the P well;
   adjusting the dosage of the first N injection region.

4. A method for adjusting a sustaining voltage for an SCR device, comprising:
   providing a SCR structure comprising a P+ injection region, a P well, an N well and a first N+ injection region that is within the P well;
   providing an LDMOS comprising a second N+ injection region, a FOX, a POLY, and the first N+ injection region;
   adjustably forming an N injection region, with a predetermined depending injection energy and doping concentration, under the P+ injection region of the SCR structure and the second N+ injection region of the LDMOS, disposed between both of the P+ injection region and the second N+ injection region and the N well, and contacting the P well.

5. The method according to claim 4, wherein the first N injection region is located under the P+ injection region and the second N+ injection region, and the first N injection region is adjacent to the P well and the N well.

* * * * *